United States Patent
Ha et al.

(10) Patent No.: US 8,987,056 B2
(45) Date of Patent: Mar. 24, 2015

(54) INTEGRATED CIRCUIT PACKAGE SYSTEM WITH SUPPORT CARRIER AND METHOD OF MANUFACTURE THEREOF

(75) Inventors: Jong-Woo Ha, Seoul (KR); Sung Yoon Lee, Inchon-si (KR); Taeg Ki Lim, Icheon (KR)

(73) Assignee: STATS ChipPAC Ltd., Singapore (SG)

( * ) Notice: Subject to any disclaimer, the term of this patent is extended or adjusted under 35 U.S.C. 154(b) by 849 days.

(21) Appl. No.: 12/273,544

(22) Filed: Nov. 19, 2008

(65) Prior Publication Data

US 2010/0123242 A1    May 20, 2010

(51) Int. Cl.
*H01L 21/00* (2006.01)
*H01L 23/31* (2006.01)
*H01L 21/56* (2006.01)
*H01L 23/498* (2006.01)
*H01L 23/00* (2006.01)
*H01L 25/03* (2006.01)
*H01L 25/065* (2006.01)

(52) U.S. Cl.
CPC ............ *H01L 23/3128* (2013.01); *H01L 21/56* (2013.01); *H01L 23/3135* (2013.01); *H01L 23/49833* (2013.01); *H01L 24/97* (2013.01); *H01L 25/03* (2013.01); *H01L 25/0657* (2013.01); *H01L 24/48* (2013.01); *H01L 2224/48091* (2013.01); *H01L 2224/48225* (2013.01); *H01L 2224/73265* (2013.01); *H01L 2224/97* (2013.01); *H01L 2225/0651* (2013.01); *H01L 2225/06562* (2013.01); *H01L 2225/06568* (2013.01); *H01L 2924/14* (2013.01); *H01L 2924/15311* (2013.01); *H01L 2924/1815* (2013.01); *H01L 2924/19107* (2013.01); *H01L 2224/32225* (2013.01); *H01L 2224/48227* (2013.01)

USPC ................... 438/109; 257/686; 257/E21.502; 257/E23.169

(58) Field of Classification Search
USPC ............ 438/109; 257/E21.502, E21.169, 686
See application file for complete search history.

(56) References Cited

U.S. PATENT DOCUMENTS

| | | | |
|---|---|---|---|
| 7,045,887 B2 * | 5/2006 | Karnezos | ...................... 257/686 |
| 7,064,426 B2 | 6/2006 | Karnezos | |
| 7,081,678 B2 | 7/2006 | Liu | |
| 7,101,731 B2 | 9/2006 | Karnezos | |
| 7,253,511 B2 | 8/2007 | Karnezos et al. | |
| 7,268,418 B2 | 9/2007 | Wang | |
| 2006/0091563 A1 | 5/2006 | Arai et al. | |
| 2006/0138631 A1 | 6/2006 | Tao et al. | |
| 2008/0142957 A1 | 6/2008 | Wang et al. | |
| 2010/0025836 A1 * | 2/2010 | Tay et al. | ...................... 257/686 |

OTHER PUBLICATIONS

Merriam-Webster's Collegiate Dictionary, Definition of "around", Merriam-Webster Incorporated., Springfield, MA, USA, 2009, p. 68.
Merriam-Webster's Collegiate Dictionary, Definition of "edge", Merriam-Webster Incorporated., Springfield, MA, USA, 2009, p. 395.

\* cited by examiner

*Primary Examiner* — Jarrett Stark
(74) *Attorney, Agent, or Firm* — Ishimaru & Associates LLP

(57) ABSTRACT

A method of manufacture of a semiconductor package system includes: attaching an internal stacking module die to a surface of an internal stacking module substrate having an internal stacking module bonding pad along an edge of an opposite surface thereof; and attaching a support carrier to support the internal stacking module substrate by two edges thereof with the internal stacking module bonding pad exposed.

19 Claims, 6 Drawing Sheets

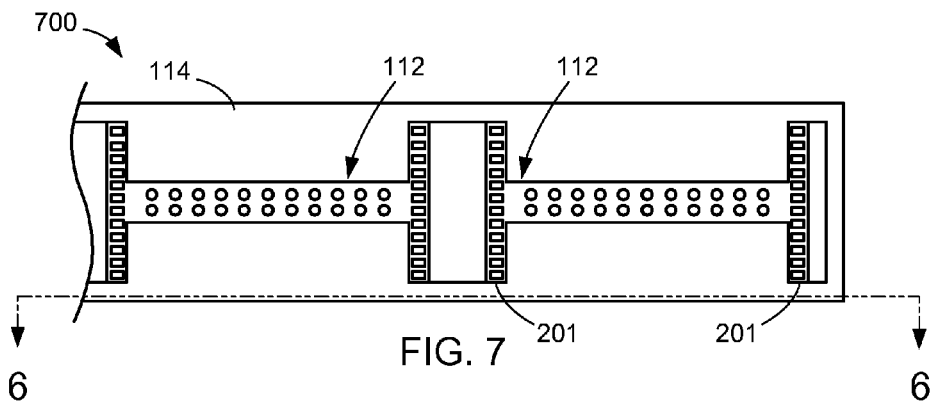
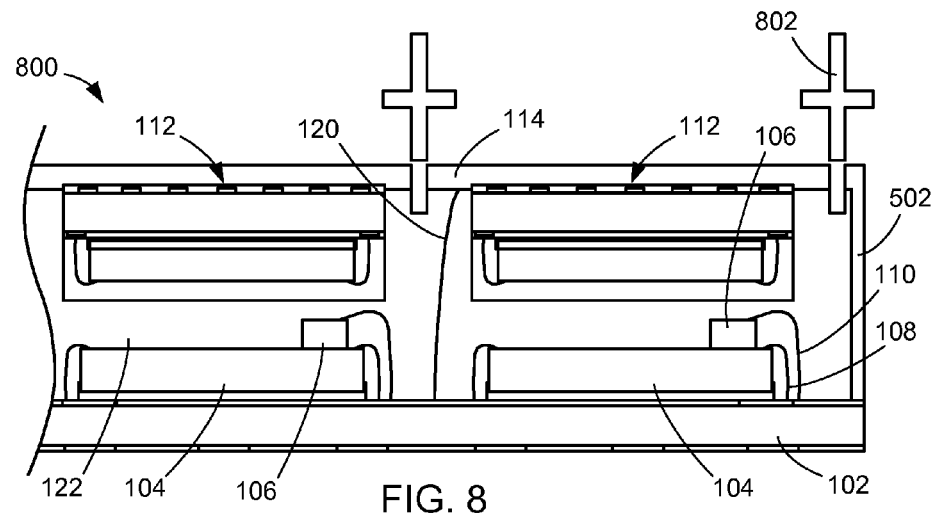
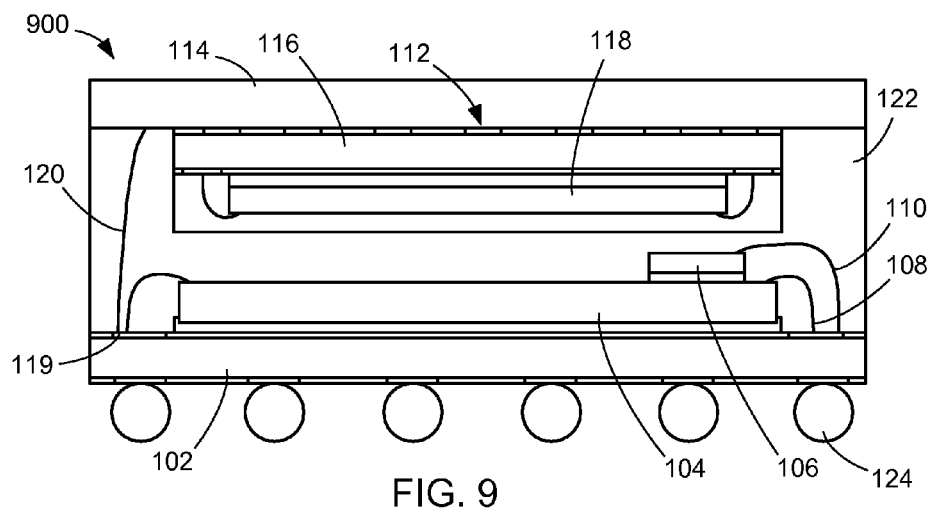

US 8,987,056 B2

INTEGRATED CIRCUIT PACKAGE SYSTEM WITH SUPPORT CARRIER AND METHOD OF MANUFACTURE THEREOF

TECHNICAL FIELD

The present invention relates generally to semiconductor packages, and more particularly to a system for a semiconductor package having a support carrier for an internal stacking module.

BACKGROUND ART

In the electronics industry, the tendency has been to reduce the size of electronic devices such as camcorders and portable telephones while increasing performance and speed. Integrated circuit packages for complex systems typically are comprised of multiple interconnected integrated circuit chips. The integrated circuit chips usually are made from a semiconductor material such as silicon or gallium arsenide. The integrated circuit chips may be mounted in packages that are then mounted on printed wiring boards.

Typically, the packages on which these integrated semiconductor chips are mounted include a substrate or other chip-mounting device. Semiconductor chips may be attached to the substrate using adhesive or any other techniques for attaching such chips to a substrate which are commonly known to those skilled in the art. The power, ground and/or signal sites on the chip may then be electrically connected to individual leads on the substrate through techniques such as wire bonding.

An interposer is an electrical interface routing between one socket or connection to another. It is an intermediate layer often used for interconnection routing or as a ground/power plane. When multiple chips are mounted within the same semiconductor package, routing problems may arise due to the different routing design of each individual chip. To solve this problem, an interposer is often used. Sometimes the terms 'substrate' and 'interposer' are used to refer to the same thing.

An internal stacking module (ISM) is typically a semiconductor integrated package that has certain designed-in functionalities. In modern semiconductor manufacturing, an ISM is typically used as an off-the-shelf component for a more complex semiconductor integrated package. Such a scheme makes integrating semiconductor chips more efficient and more cost-effective. A semiconductor package that has an ISM as a component is typically called a Package-in-Package (PiP) package.

Conventionally, one or more semiconductor dies are manufactured and are mounted on a main substrate. Afterwards, an ISM is attached to the mounted semiconductor die(s) using a spacer layer and an adhesive layer. Then, the different parts of the assembly are encapsulated in a mold compound. A singulation process is utilized to realize individually separated semiconductor packages.

A problem with the conventional PiP package is that warpage of the embedded ISM often occurs. This is because the spacer layer and the adhesive layer that connect the ISM to the mounted semiconductor die(s) are often positioned at the center of the ISM so that the stress exerted upon the ISM is not uniform across the ISM. Such a warpage has increased the rate of failure of the ISM and consequently the rate of failure of the PiP package and in turn increased the cost of the PiP package.

Another problem with the conventional PiP package is that tilting of the embedded ISM often occurs. Tilting occurs when the ISM rotates around a pivot point, which is the contact point between the ISM and the mounted semiconductor die(s). This is also due to the fact that the spacer layer and the adhesive layer that connect the ISM to the mounted semiconductor die(s) are often positioned at the center of the ISM and are often of small contact area so that the adhesion of the ISM to the mounted semiconductor die(s) is inadequate. Such a tilting has increased the rate of failure of the ISM and consequently the rate of failure of the PiP package and in turn increased the cost of the PiP package.

Thus, a need still remains for reducing the warpage and tilting problems of the PiP packages and also for reducing the cost of such PiP packages. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of a semiconductor package system including: attaching an internal stacking module die to a surface of an internal stacking module substrate having an internal stacking module bonding pad along an edge of an opposite surface thereof; and attaching a support carrier to support the internal stacking module substrate by two edges thereof with the internal stacking module bonding pad exposed.

The present invention provides a semiconductor package system including: an internal stacking module substrate having an internal stacking module bonding pad along an edge of a surface thereof; an internal stacking module die attached to an opposite surface of the internal stacking module substrate, and a support carrier supporting the internal stacking module substrate by two edges thereof with the internal stacking module bonding pad exposed.

Certain embodiments of the invention have other aspects in addition to or in place of those mentioned above. The aspects will become apparent to those skilled in the art from a reading of the following detailed description when taken with reference to the accompanying drawings.

BRIEF DESCRIPTION OF THE DRAWINGS

FIG. 7 is a top view similar to FIG. 2 of the unfinished semiconductor package system having a support carrier of the first embodiment of the present invention after the stacking stage of the process.

FIG. 8 is a cross-sectional view similar to FIG. 1 of an unfinished semiconductor package system having a support carrier of the first embodiment of the present invention after a molding stage of the process.

FIG. 9 is a cross-sectional view similar to FIG. 1 of a finished semiconductor package system having a support carrier of the first embodiment of the present invention after a stage of singulation.

BEST MODE FOR CARRYING OUT THE INVENTION

Figure 1:
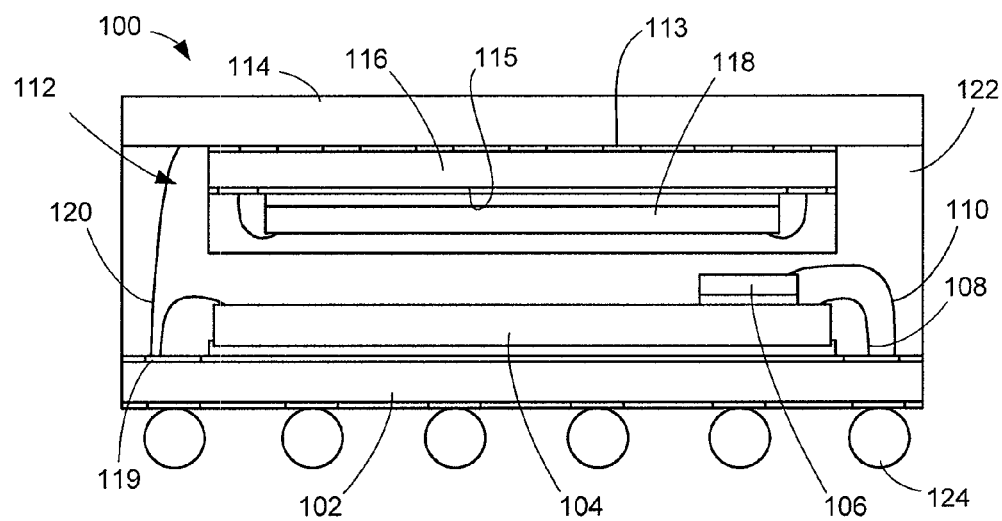
FIG. 1 is a cross-sectional view of a semiconductor package system in a first embodiment of the present invention along line 1-1 of FIG. 2 after a stage of singulation.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. Likewise, the drawings showing embodiments of the system are semi-diagrammatic and not to scale and, particularly, some of the dimensions are for the clarity of presentation and are shown exaggerated in the drawings. Also, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the leadframe, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "coplanar" is defined as being in the same plane or flat. With regard to an unfinished leadframe, the term means that the unfinished leadframe is in one plane and flat as contrasted with having different heights.

Figure 2:
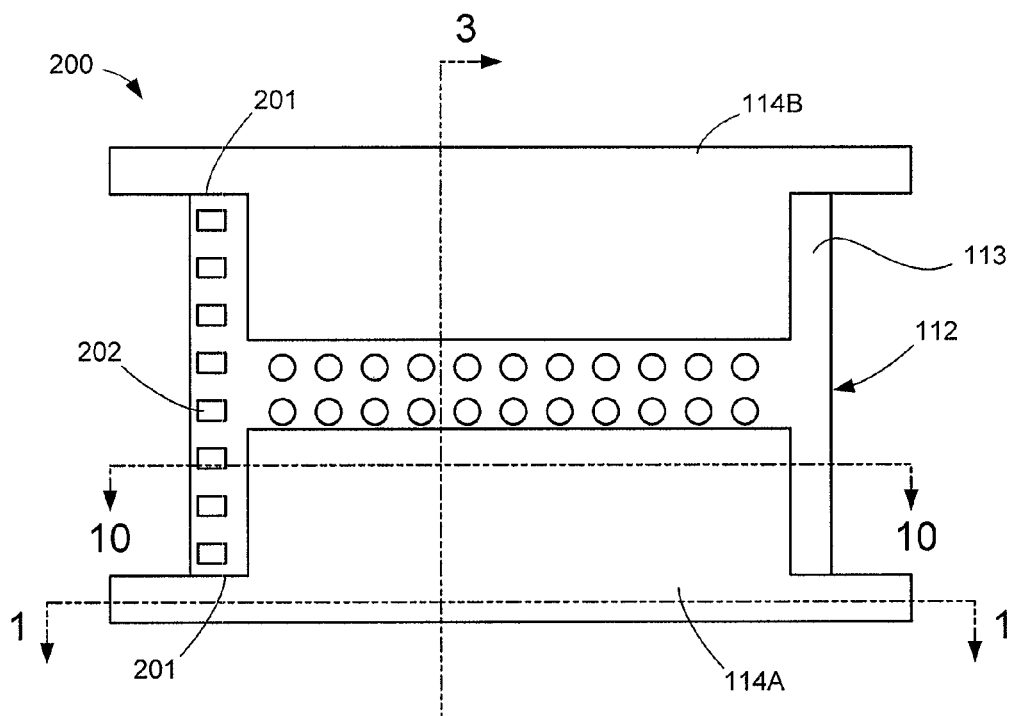
FIG. 2 is a top view of the semiconductor package system having a support carrier of the first embodiment of the present invention after a stage of singulation.

Referring now to FIG. 1, therein is shown a cross-sectional view of a semiconductor package system in a first embodiment of the present invention along line 1-1 of FIG. 2 after a stage of singulation.

A semiconductor package system 100 is shown. The semiconductor package system 100 has a bottom substrate 102. A bottom die 104 is attached to the bottom substrate 102. A top die 106 is attached to the bottom die 104. The bottom die 104 is connected to the bottom substrate 102 through a first type bonding wire 108. The top die 106 is connected to the bottom substrate 102 through a second type bonding wire 110.

The semiconductor package system 100 also has an internal stacking module 112. In at least one embodiment, the internal stacking module 112 can be placed over or directly over the bottom die 104. The internal stacking module 112 is attached to a support carrier 114. The support carrier 114 is a piece of substrate material that serves as a holder for the internal stacking module 112. The internal stacking module 112 can be attached to the support carrier 114 through an adhesive or glue material. The support carrier 114 could be made out of metal or other materials. A support carrier made out of metal could also serve as a heat sink for the internal stacking module 112.

The internal stacking module 112 has an internal stacking module substrate 116 and an internal stacking module die 118. The internal stacking module substrate 116 of the internal stacking module 112 is shown having a top surface 113 and a bottom surface 115 opposite the top surface 113. The bottom surface 115 of the internal stacking module substrate 116 is shown having the internal stacking module die 118 mounted thereon. The internal stacking module 112 is connected to a bottom substrate bonding pad 119 on the bottom substrate 102 through an internal stacking module bonding wire 120.

The bottom die 104, the top die 106, the first type bonding wire 108, the second type bonding wire 110, the internal stacking module 112, and the internal stacking module bonding wire 120 are encapsulated in a mold compound 122. In at least one embodiment, the mold compound 122 can be formed between the internal stacking module 112 and the bottom die 104. A solder ball 124 is attached to the bottom surface of the bottom substrate 102.

In the current embodiment of the present invention, the internal stacking module 112 is not connected to the bottom die 104 or the top die 106 through a spacer layer and an adhesive layer as an internal stacking module in a conventional semiconductor package system is. The internal stacking module 112 is held together to the bottom die 104 and the top die 106 through the mold compound 122. In at least one embodiment, the top die 106 can be placed between the bottom die 104 and the internal stacking module 112. At the same time, the internal stacking module 112 is attached to the support carrier 114. It has been discovered that such a configuration provides a contact area between the internal stacking module 112 and the support carrier 114 sufficiently large that it effectively prevents the warpage and tilting of the internal stacking module 112. Such a configuration will reduce the failure rate of the PiP packages so configured and will reduce the cost of manufacturing such PiP packages.

Referring now to FIG. 2, therein is shown a top view of the semiconductor package system 200 having a support carrier of the first embodiment of the present invention after a stage of singulation.

The support carrier 114 of FIG. 1 has two symmetrical parts: a left support carrier part 114A and a right support carrier part 114B. The left support carrier part 114A and the right support carrier part 114B cover two edges 201 of the internal stacking module 112. The internal stacking module 112 has an internal stacking module bonding pad 202 on the top surface 113. The right support carrier part 114B and the left support carrier part 144A do not cover the internal staking module bonding pad 202. The internal stacking module bonding wire 120 of FIG. 1 connects the internal stacking module bonding pad 202 to the bottom substrate bonding pad 119 on the bottom substrate 102 of FIG. 1. The internal stacking module bonding pad 202 is not shown in FIG. 1.

It has been discovered that the fact that the two edges 201 of the internal stacking module 112 are covered by the support carrier 114 prevents warpage and tilting of the internal stacking module 112. Such a configuration will reduce the failure rate of the PiP packages so configured and will reduce the cost of manufacturing such PiP packages.

Figure 3:
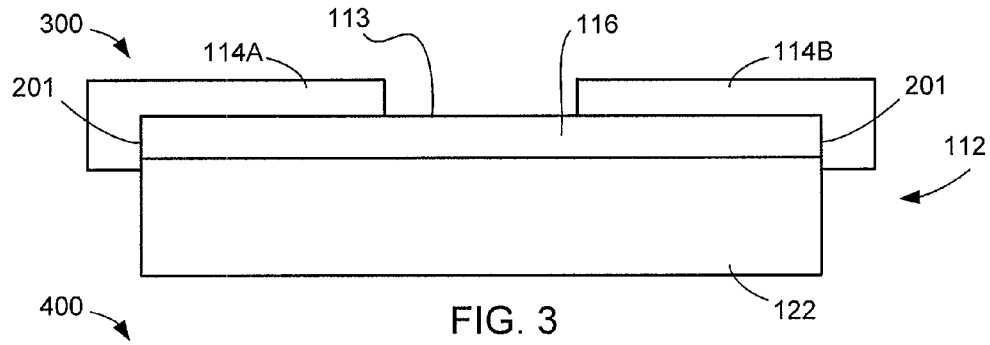
FIG. 3 is a cross-sectional view of the semiconductor package system having a support carrier of the first embodiment of the present invention along line 3-3 of FIG. 2 after a stage of singulation.

Referring now to FIG. 3, therein is shown a cross-sectional view of the semiconductor package system having a support carrier of the first embodiment of the present invention along line 3-3 of FIG. 2 after a stage of singulation.

The left support carrier part 114A and the right support carrier part 114B are shown to cover and wrap around the two edges 201 of the internal stacking module 112. The left support carrier part 114A is shown attached to the top surface 113 of the internal staking module substrate 116 of the internal stacking module 112. It has been discovered that this configuration further prevents warpage and tilting of the internal stacking module 112. Such a configuration will reduce the failure rate of the PiP packages so configured and will reduce the cost of manufacturing such PiP packages.

Figure 4:
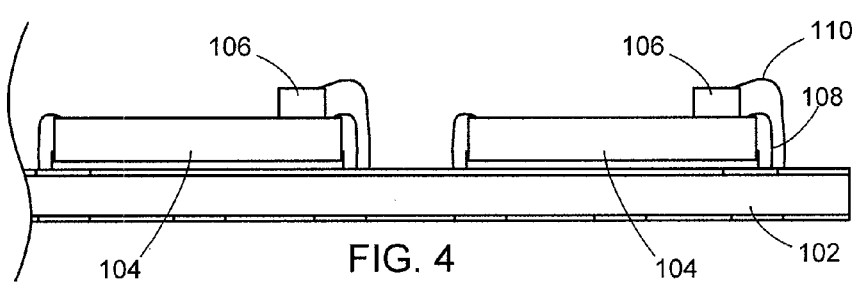
FIG. 4 is a cross-sectional view similar to FIG. 1 of an unfinished semiconductor package system having a support carrier of the first embodiment of the present invention after a semiconductor chip mounting stage of the process.

Referring now to FIG. 4, therein is shown a cross-sectional view similar to FIG. 1 of an unfinished semiconductor package system 400 having a support carrier of the first embodiment of the present invention after a semiconductor chip mounting stage of the process.

The bottom substrate 102 is provided. The bottom die 104 is attached to the bottom substrate 102. The top die 106 is attached to the bottom die 104. The bottom die 104 is connected to the bottom substrate 102 through the first type bonding wire 108. The top die 106 is connected to the bottom substrate 102 through the second type bonding wire 110.

Figure 5:
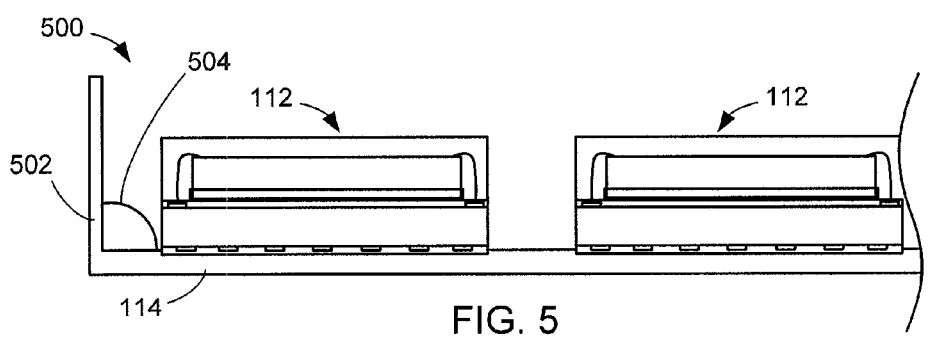
FIG. 5 is a cross-sectional view similar to FIG. 1 of an unfinished semiconductor package system having a support carrier of the first embodiment of the present invention after an ISM mounting stage of the process.

Referring now to FIG. 5, therein is shown a cross-sectional view similar to FIG. 1 of an unfinished semiconductor package system 500 having a support carrier of the first embodiment of the present invention after an ISM mounting stage of the process.

The internal stacking module 112 is attached to the support carrier 114. The support carrier 114 is connected to a support carrier bar 502 at an angle 504. The support carrier bar 502 could be vertical to the support carrier 114 and also vertical to the surface of the internal stacking module 112.

Figure 6:
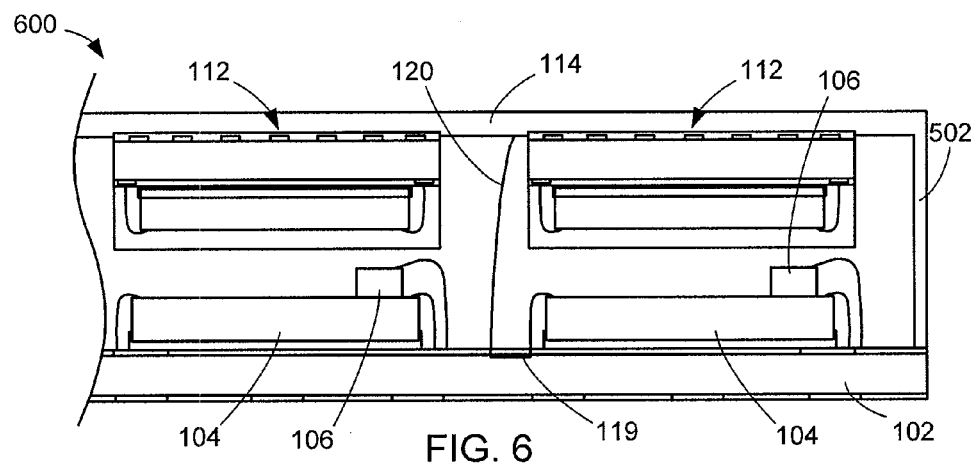
FIG. 6 is a cross-sectional view similar to FIG. 1 of an unfinished semiconductor package system having a support carrier of the first embodiment of the present invention along line 6-6 of FIG. 7 after a stacking stage of the process.

Referring now to FIG. 6, therein is shown cross-sectional view similar to FIG. 1 of an unfinished semiconductor package system 600 having a support carrier of the first embodiment of the present invention along line 6-6 of FIG. 7 after a stacking stage of the process.

The support carrier 114 attached with the internal stacking module 112 is positioned on the bottom substrate 102 having the bottom die 104 and the top die 106. The support carrier bar 502 is in touch with the bottom substrate 102 and serves as the support for the support carrier 114 attached with the internal stacking module 112. The internal stacking module 112 is not in physical contact with either the bottom die 104 or the top die 106. The internal stacking module bonding wire 120 connects the internal stacking module 112 to the bottom substrate bonding pad 119 on the bottom substrate 102.

This method of assembling the internal stacking module 112 with the bottom die 104 and the top die 106 is simpler than the conventional method involving spacer and adhesive layers. It has been discovered that such method simplifies the manufacturing process and reduces the manufacturing cost.

Referring now to FIG. 7, therein is shown a top view similar to FIG. 2 of the unfinished semiconductor package system 700 having a support carrier of the first embodiment of the present invention after the stacking stage of the process.

It still shows that the support carrier 114 covers the two edges 201 of the internal stacking module 112.

Referring now to FIG. 8, therein is shown a cross-sectional view similar to FIG. 1 of an unfinished semiconductor package system 800 having a support carrier of the first embodiment of the present invention after a molding stage of the process.

The bottom die 104, the top die 106, the first type bonding wire 108, the second type bonding wire 110, the internal stacking module 112, and the internal stacking module bonding wire 120 are encapsulated in the mold compound 122.

A singulation process is done by a dicing blade 802 cutting through the unfinished semiconductor package system 800. The support carrier bar 502 is severed from the support carrier 114 by the singulation process.

Referring now to FIG. 9, therein is shown a cross-sectional view similar to FIG. 1 of a finished semiconductor package system 900 having a support carrier of the first embodiment of the present invention after a stage of singulation.

The solder ball 124 is attached to the bottom substrate 102, resulting in a finished package.

Figure 10:
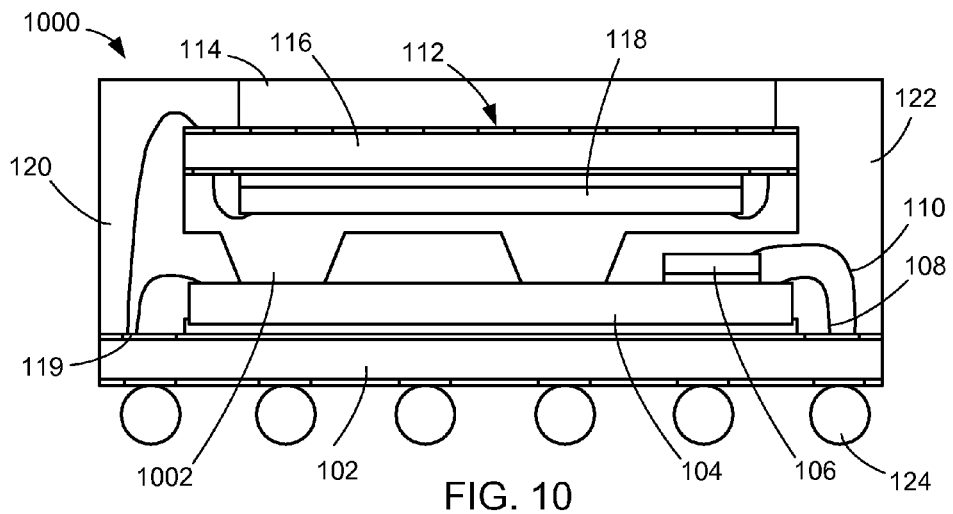
FIG. 10 is a cross-sectional view similar to FIG. 1 of a semiconductor package system having a support carrier of a first embodiment of the present invention along line 10-10 of FIG. 2 and having a modified ISM, after a stage of singulation.

Referring now to FIG. 10, therein is shown a cross-sectional view similar to FIG. 1 of a semiconductor package system 1000 having a support carrier of a first embodiment of the present invention along line 10-10 of FIG. 2 and having a modified ISM, after a stage of singulation.

In this embodiment of the present invention, the internal stacking module 112 has an internal stacking module protrusion 1002. The internal stacking module protrusion 1002 is formed during the process of building the internal stacking module 112. Specifically, the internal stacking module protrusion 1002 is formed in the molding step during the forming of the internal stacking module 112.

The forming of the internal stacking module protrusion 1002 is directed at improving the bonding between the internal stacking module 112 and the support carrier 114. During the stacking stage of the manufacturing process as illustrated in FIG. 6, there is little to hold the internal stacking module 112 up against the support carrier 114. On issue with this configuration in FIG. 6 is that detachment between the internal stacking module 112 and the support carrier 114 sometimes occurs.

It has been discovered that the internal stacking module protrusion 1002 improves the bonding between the internal stacking module 112 and reduces the occurrence of detachment by propping up the internal stacking module 112 up against the support carrier 114 during the stacking stage of the manufacturing process. Such a configuration will reduce the failure rate of the PiP packages so configured and will reduce the cost of manufacturing such PiP packages.

Figure 11:
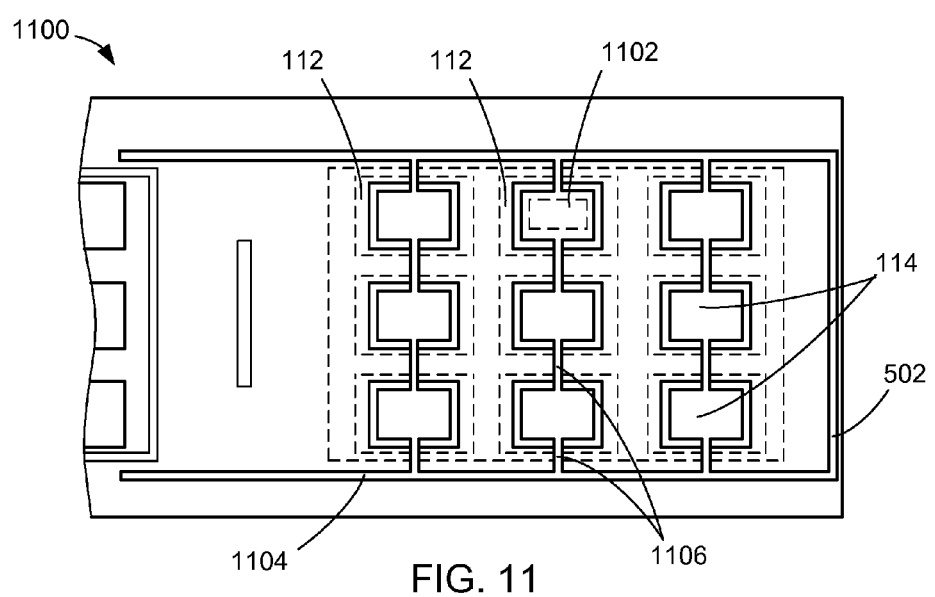
FIG. 11 is a top view of a semiconductor package system having a support carrier of a second embodiment of the present invention after an intermediate stage of the process.

Referring now to FIG. 11, therein is shown a top view of a semiconductor package system 1100 having a support carrier of a second embodiment of the present invention after an intermediate stage of the process.

The internal stacking module 112 and the support carrier 114 are shown. The support carrier bar 502 is connected to a support carrier beam 1104. A support carrier arm 1106 connects the support carrier 114 to the support carrier beam 1104 and connects the support carrier 114 to each other.

In the current embodiment of the present invention, instead of covering the two edges 201 of the internal stacking module 112, as shown in FIG. 2, the support carrier 114 covers a center portion 1102 of the internal stacking module 112.

The current embodiment of the present invention is directed to improve the wire bonding process encountered in the first embodiment of the present invention. The wire bonding process is done by a bonding capillary moving to bond the internal stacking module bonding wire 120 to the internal stacking module bonding pad 202 on the internal stacking module 112, to extend some internal stacking module bonding wire 120, and then to bond the internal stacking module bonding wire 120 to the bottom substrate bonding pad 119 on the bottom substrate 102 of FIG. 1. Since the support carrier 114 covers the two edges 201 of FIG. 2 of the internal stacking module 112, the support carrier 114 extends to the corner of the internal stacking module 112, where the clearance for the bonding capillary motion during the wire bonding process is not enough. It has been discovered that the current embodiment of the present invention as shown in FIG. 11 solves the problem of the bonding capillary motion during the wire bonding process by utilizing the support carrier 114 that covers the center portion of the internal stacking module 112, thus resulting in sufficient clearance for the bonding capillary motion at the corner of the internal stacking module 112 during the wire bonding process.

Figure 12:
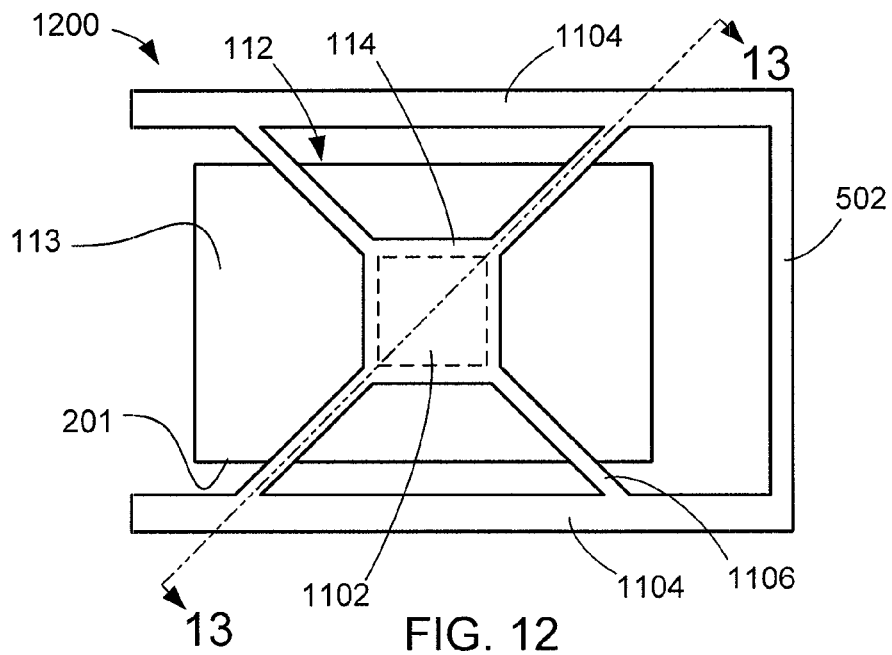
FIG. 12 is a top view similar to FIG. 11 of a semiconductor package system having a support carrier of a third embodiment of the present invention after an intermediate stage of the process.

Referring now to FIG. 12, therein is shown a top view similar to FIG. 11 of a semiconductor package system 1200 having a support carrier of a third embodiment of the present invention after an intermediate stage of the process.

The internal stacking module 112 and the support carrier 114 are shown. In the current embodiment of the present invention, instead of covering the two edges 201 of the internal stacking module 112, as shown in FIG. 2, the support carrier 114 covers the center portion 1102 of the internal stacking module 112. The support carrier 114 is shown attached to the top surface 113 of the internal stacking module 112 while having the support carrier beams 1104 peripheral to the edge 201 of the internal stacking module 112.

It has been discovered that such a configuration solves the clearance issue of the bonding capillary motion during the wire bonding process as might be encountered during implementing the first embodiment of the present invention as shown in FIG. 2.

Figure 13:
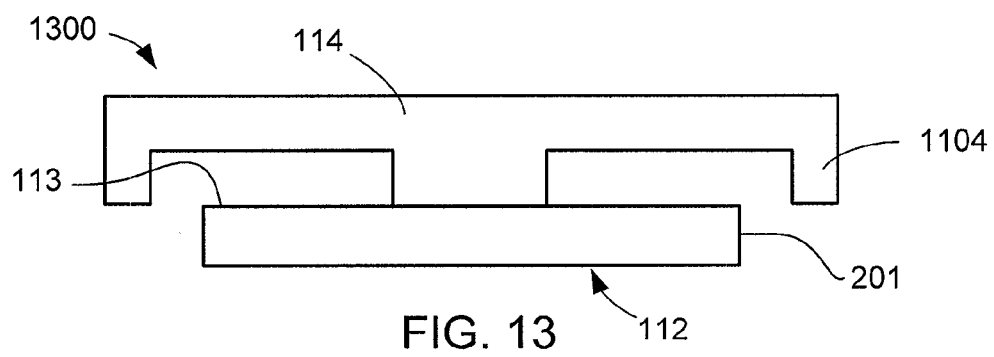
FIG. 13 is a cross-sectional view of the semiconductor package system having a support carrier of the third embodiment of the present invention along line 13-13 of FIG. 12 after an intermediate stage of the process.

Referring now to FIG. 13, therein is shown a cross-sectional view of the semiconductor package system 1300 having a support carrier of the third embodiment of the present invention along line 13-13 of FIG. 12 after an intermediate stage of the process. The internal stacking module 112 and the support carrier 114 are shown. The support carrier 114 is shown attached to the ton surface 113 of the internal stacking module 112 while having the support carrier beams 1104 peripheral to the edge 201 of the internal stacking module 112.

Figure 14:
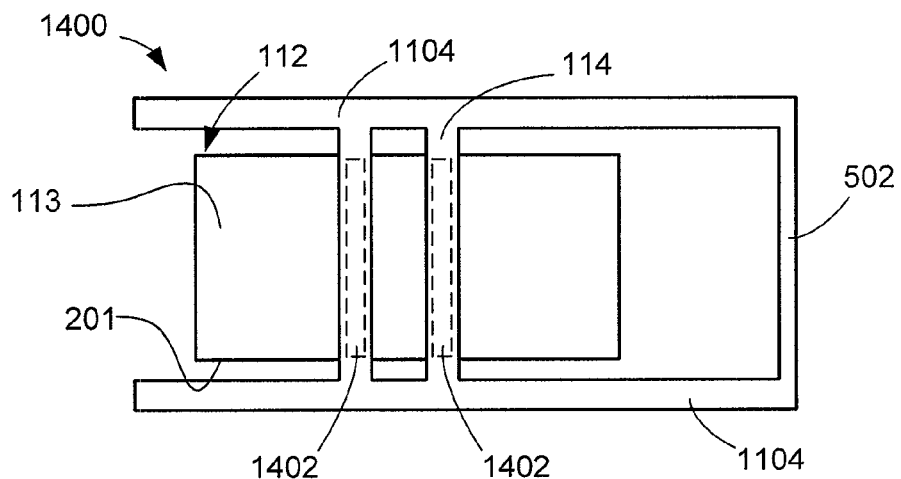
FIG. 14 is a top view similar to FIG. 11 of a semiconductor package system having a support carrier of a fourth embodiment of the present invention after an intermediate stage of the process.

Referring now to FIG. 14, therein is shown a top view similar to FIG. 11 of a semiconductor package system 1400 having a support carrier of a fourth embodiment of the present invention after an intermediate stage of the process.

The internal stacking module 112 and the support carrier 114 are shown. In the current embodiment of the present invention, instead of covering the two edges 201 of the internal stacking module 112, as shown in FIG. 2, the support carrier 114 covers two stripes 1402 of the internal stacking module 112. The support carrier 114 is shown attached to the top surface 113 of the internal stacking module 112 while having the support carrier beams 1104 peripheral to the edge 201 of the internal stacking module 112.

It has been discovered that such a configuration solves the clearance issue of the bonding capillary motion during the wire bonding process as might be encountered during implementing the first embodiment of the present invention as shown in FIG. 2.

Figure 15:
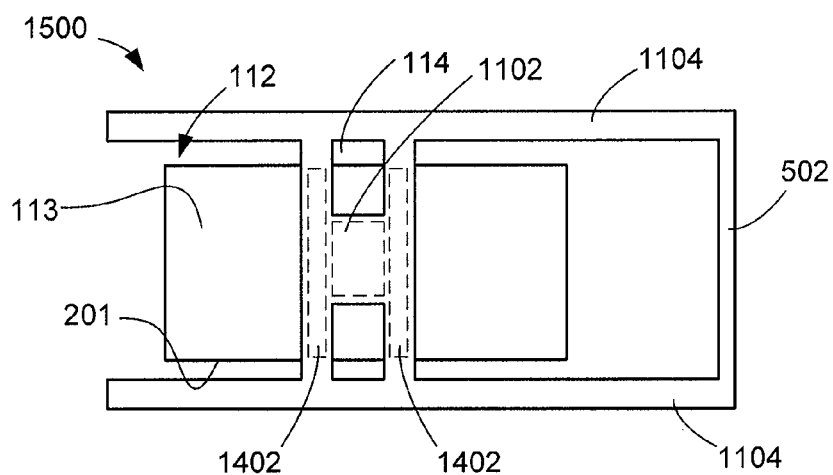
FIG. 15 is a top view similar to FIG. 11 of a semiconductor package system having a support carrier of a fifth embodiment of the present invention after an intermediate stage of the process.

Referring now to FIG. 15, therein is shown a top view similar to FIG. 11 of a semiconductor package system 1500 having a support carrier of a fifth embodiment of the present invention after an intermediate stage of the process.

The internal stacking module 112 and the support carrier 114 are shown. In the current embodiment of the present invention, instead of covering the two edges 201 of the internal stacking module 112, as shown in FIG. 2, the support carrier 114 covers the two stripes 1402 and the center portion 1102 of the internal stacking module 112. The support carrier 114 is shown attached to the top surface 113 of the internal stacking module 112 while having the support carrier beams 1104 peripheral to the edge 201 of the internal stacking module 112.

It has been discovered that such a configuration solves the clearance issue of the bonding capillary motion during the wire bonding process as might be encountered during implementing the first embodiment of the present invention as shown in FIG. 2.

Figure 16:
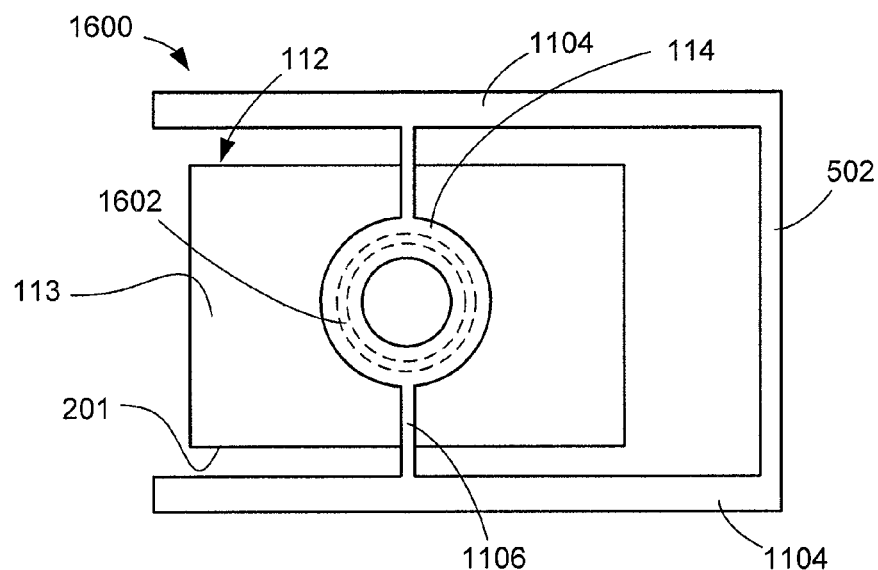
FIG. 16 is a top view similar to FIG. 11 of a semiconductor package system having a support carrier of a sixth embodiment of the present invention after an intermediate stage of the process.

Referring now to FIG. 16, therein is shown a top view similar to FIG. 11 of a semiconductor package system 1600 having a support carrier of a sixth embodiment of the present invention after an intermediate stage of the process.

The internal stacking module 112 and the support carrier 114 are shown. In the current embodiment of the present invention, instead of covering the two edges 201 of the internal stacking module 112, as shown in FIG. 2, the support carrier 114 covers a circular stripe 1602 of the center portion of the internal stacking module 112. The support carrier 114 is shown attached to the top surface 113 of the internal stacking module 112 while having the support carrier beams 1104 peripheral to the edge 201 of the internal stacking module 112.

It has been discovered that such a configuration solves the clearance issue of the bonding capillary motion during the wire bonding process as might be encountered during implementing the first embodiment of the present invention as shown in FIG. 2.

Figure 17:
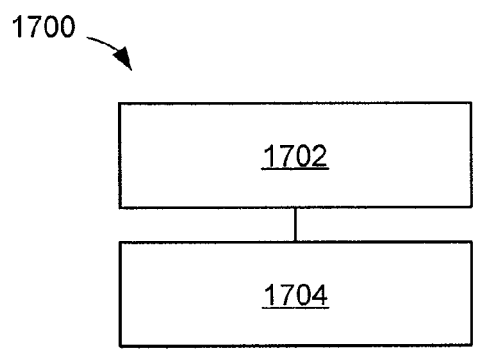
FIG. 17 is a flow chart of a method of manufacture of a semiconductor package system in an embodiment of the present invention.

Referring now to FIG. 17, therein is shown a flow chart of a method 1700 of manufacture of the semiconductor package system in an embodiment of the present invention. The method 1700 includes attaching an internal stacking module die to a surface of an internal stacking module substrate having an internal stacking module bonding pad along an edge of an opposite surface thereof in a block 1702; and attaching a support carrier to support the internal stacking module substrate by two edges thereof with the internal stacking module bonding pad exposed in a block 1704.

It is discovered that the present invention prevents the warpage and tilting of an internal stacking module in a PiP package by using a support carrier to hold the internal stacking module during the manufacturing process. In so doing, the failure rate of the internal stacking module and the PiP packages are reduced, resulting in reduced cost. It also simplifies the manufacturing process compared to the conventional process involving spacer and adhesive and thus reduces cost of the manufacturing process.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for improving yield, increasing reliability, reducing complexity, and reducing cost of integrated circuit system. The resulting processes and configurations are straightforward, cost-effective, uncomplicated, highly versatile and effective, can be surprisingly and unobviously implemented by adapting known technologies, and are thus readily suited for efficiently and economically manufacturing integrated circuit package system fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of a semiconductor package system comprising:
   attaching an internal stacking module die to a surface of an internal stacking module substrate, the internal stacking module substrate having an internal stacking module bonding pad along an edge of a surface that is opposite the surface having the internal stacking module die attached; and
   attaching a support carrier attached to the surface of the internal stacking module substrate having the internal stacking module bonding pad and wrapped around an edge of the internal stacking module substrate or peripheral to an edge of the internal stacking module substrate while leaving the internal stacking module bonding pad not covered by the support carrier.

2. The method as claimed in claim 1 further comprising:
   attaching a bottom die to a bottom substrate; and
   connecting the internal stacking module bonding pad to a bottom substrate bonding pad of the bottom substrate through an internal stacking module bonding wire.

3. The method as claimed in claim 1 wherein attaching a support carrier includes attaching a left support carrier part and a right support carrier part to cover two edges of the internal stacking module substrate, the left support carrier part being symmetrical to the right support carrier part.

4. The method as claimed in claim 1 wherein attaching a support carrier includes attaching a support carrier covering a center portion of the internal stacking module.

5. The method as claimed in claim 1 wherein attaching a support carrier includes attaching the support carrier to an internal stacking module having an internal stacking module protrusion.

6. A method of manufacture of a semiconductor package system comprising:
   providing an internal stacking module with an internal stacking module die attached to a surface of an internal stacking module substrate, the internal stacking module substrate having an internal stacking module bonding pad along an edge of a surface that is opposite the surface having the internal stacking module die attached;
   attaching a support carrier to the surface of the internal stacking module substrate having the internal stacking module bonding pad, the support carrier connected to a support carrier beam peripheral to an edge of the internal stacking module substrate while leaving the internal stacking module bonding pad not covered by the support carrier;
   attaching a bottom die to a bottom substrate;
   attaching the internal stacking module over the bottom die; and
   encapsulating the bottom die and the internal stacking module in a mold compound, the mold compound formed between the bottom die and the internal stacking module.

7. The method as claimed in claim 6 further comprising:
   connecting the internal stacking module to a bottom substrate bonding pad on the bottom substrate through an internal stacking module bonding wire.

8. The method as claimed in claim 6 wherein attaching the support carrier includes attaching the support carrier to cover two stripes of the internal stacking module.

9. The method as claimed in claim 6 further comprising:
   singulating to remove a support carrier bar.

10. The method as claimed in claim 6 wherein attaching the support carrier includes attaching the support carrier to cover a circular stripe of the internal stacking module.

11. A semiconductor package system comprising:
   an internal stacking module including an internal stacking module substrate having an internal stacking module bonding pad along an edge of a surface thereof and an internal stacking module die attached to the internal stacking module substrate on a surface opposite the internal stacking module bonding pad;
   a support carrier attached to the surface of the internal stacking module substrate having the internal stacking module bonding pad, the support carrier connected to a support carrier beam peripheral to an edge of the internal stacking module substrate while leaving the internal stacking module bonding pad not covered by the support carrier;
   a bottom die over a bottom substrate, the internal stacking module over the bottom die; and
   a mold compound around the bottom die and the internal stacking module and between the bottom die and the internal stacking module.

12. The system as claimed in claim 11 further comprising:
   an internal stacking module bonding wire connecting the internal stacking module bonding pad to a bottom substrate bonding pad of the bottom substrate.

13. The system as claimed in claim 11 wherein the support carrier covers a center portion of the internal stacking module.

14. The system as claimed in claim 11 wherein the internal stacking module has an internal stacking module protrusion.

15. The system as claimed in claim 11 further comprising:
a top die between the bottom die and the internal stacking module.

16. The system as claimed in claim 15 wherein the internal stacking module bonding pad is connected to a bottom substrate bonding pad through an internal stacking module bonding wire.

17. The system as claimed in claim 15 wherein the support carrier covers two stripes of the internal stacking module.

18. The system as claimed in claim 15 wherein the support carrier covers two stripes and a center portion of the internal stacking module.

19. The system as claimed in claim 15 wherein the support carrier covers a circular stripe of the internal stacking module.

* * * * *

UNITED STATES PATENT AND TRADEMARK OFFICE
CERTIFICATE OF CORRECTION

PATENT NO. : 8,987,056 B2  
APPLICATION NO. : 12/273544  
DATED : March 24, 2015  
INVENTOR(S) : Ha et al.

It is certified that error appears in the above-identified patent and that said Letters Patent is hereby corrected as shown below:

In the Specification:

Column 8, line 4, delete "the ton" and insert therefor --the top--

Signed and Sealed this
Fifteenth Day of December, 2015

Michelle K. Lee
*Director of the United States Patent and Trademark Office*